United States Patent [19]

Abel et al.

[11] Patent Number: 4,561,586

[45] Date of Patent: Dec. 31, 1985

[54] METHOD OF REMOVING A SOLDERED INTEGRATED CIRCUIT PACKAGE FROM A PRINTED CIRCUIT BOARD

[75] Inventors: Kenneth N. Abel, Vista; Gerald R. Dunn, Carlsbad, both of Calif.

[73] Assignee: Burroughs Corporation, Detroit, Mich.

[21] Appl. No.: 646,747

[22] Filed: Sep. 4, 1984

[51] Int. Cl.[4] .............................................. B23K 3/00
[52] U.S. Cl. .................................... 228/264; 228/119
[58] Field of Search ......................... 228/19, 119, 264

[56] References Cited

U.S. PATENT DOCUMENTS

| | | | |
|---|---|---|---|
| 3,731,866 | 5/1973 | Mason et al. | 228/19 X |
| 3,815,806 | 6/1974 | Paxton | 228/264 X |
| 4,295,596 | 10/1981 | Doten et al. | 228/264 X |
| 4,506,820 | 3/1985 | Brucker | 228/39 |

FOREIGN PATENT DOCUMENTS 2050906  1/1981  United Kingdom ................ 228/264

*Primary Examiner*—Nicholas P. Godici
*Assistant Examiner*—M. Jordan

*Attorney, Agent, or Firm*—Charles J. Fassbender; Kevin R. Peterson

[57] ABSTRACT

A method is disclosed for removing an integrated circuit package that has multiple leads which are soldered into respective metal plated holes in a printed circuit board. The board is of the type that has internal metal lines which make joints with the metal plating, and the method is adapted to remove the package from the board without overstressing the joints. The method includes the steps of: flowing a liquid on the leads at a temperature higher than the melting temperature of the solder without pulling on the package for a time period $\Delta t_1$; and pulling on the package immediately after the end of the $\Delta t_1$ period with a force $F_1 = F_3 + (25 \text{ to } 75)\% \ F_2$. Force $F_2$ is the minimum force that will extract a single soldered lead from the board under the condition the solder is below but within 5° C. of melting; $F_3$ is the minimum force that will lift the package from a pool of the liquid; and $\Delta t_1$ is the time it takes to pull the package from the board with force $F_1$ being continuously applied while the liquid is flowing on the package leads to melt the solder plus one to three seconds.

10 Claims, 7 Drawing Figures

METHOD OF REMOVING A SOLDERED INTEGRATED CIRCUIT PACKAGE FROM A PRINTED CIRCUIT BOARD

BACKGROUND OF THE INVENTION

This invention relates to apparatus for removing, and methods of removing, integrated circuit packages from a printed circuit board; and more particularly it relates to such apparatus and methods of removing pin grid array packages without fracturing conductive joints in the board.

By an integrated circuit package is herein meant the combination of an integrated circuit die that is encapsulated in a protective material such as ceramic or plastic from which a plurality of signal leads extend. In order to make a larger electronic module, the signal leads of several packages are soldered into metal plated holes of a printed circuit board and selectively interconnected by patterned metal layers within the board.

Whenever a package on a circuit board becomes defective, either the entire board is thrown away or some means is used to remove the solder from around the leads of the defective package so it can be replaced. Traditionally, the number of signal leads in integrated circuit packages has been relatively small such as eight or sixteen. With those packages, a soldering iron is used to heat and remove the solder from each pin of the package one at a time.

Recently, however, the amount of circuitry that has been put on the single semiconductor die has increased; and so the number of signal leads that extend from the package has also increased. Pin grid array packages are presently being developed which have from 50 to 250 leads. In a pin grid array package, the leads extend perpendicular to one flat surface of the encapsulant in an array-like pattern.

Since the number of leads in a pin grid array package is so large, it is impractical to desolder them one at a time because it simply takes too long. For example, at a desoldering rate of one pin per minute, it would take about three hours to remove a one-hundred-eighty pin package.

In addition, during the removal of a pin grid array package from a printed circuit board, extreme care must be taken not to fracture the joints between the plated metal holes and the patterned conductors inside of the board. These joints are so fragile that they can fracture if the package is pulled on continuously with an extraction tool while the solder around the pins is being heated; and they can also fracture if the package is pulled on when the solder around some but not all of the pins of the package have been melted.

Accordingly, a primary object of the invention is to provide an improved method of removing a soldered leaded package from a printed circuit board.

Another more specific object of the invention is to provide a method of removing a pin grid array package from a printed circuit board without fracturing any of the joints which the board's internal conductors make with the plated metal holes into which the package leads fit.

BRIEF SUMMARY OF THE INVENTION

The above objects, and others, of removing an integrated circuit package that has multiple leads which are soldered into respective metal plated holes in a printed circuit board are achieved in accordance with the invention by the steps of flowing on the leads a liquid at a temperature above the melting temperature of the solder without pulling on the package for a time period $\Delta t_1$; and pulling on the package immediately after the end of time period $\Delta t_1$ with a force $F_1 = F_3 + (25$ to $75)\% F_2$ wherein $F_2$ is the minimum force that will extract a single soldered lead from the board under the condition the solder is below but within 5° C. of melting; $F_3$ is the minimum force that will lift the package from a pool of the liquid; and $\Delta t_1$ is the time it takes to pull the package from the board with force $F_1$ being continuously applied while the liquid is flowing on the leads to melt the solder plus one to three seconds.

BRIEF DESCRIPTION OF THE DRAWINGS

Various features and advantages of the invention are described in the Detailed Description in conjunction with the accompanying drawings wherein.

DETAILED DESCRIPTION OF THE INVENTION

Figures 1, 1A:
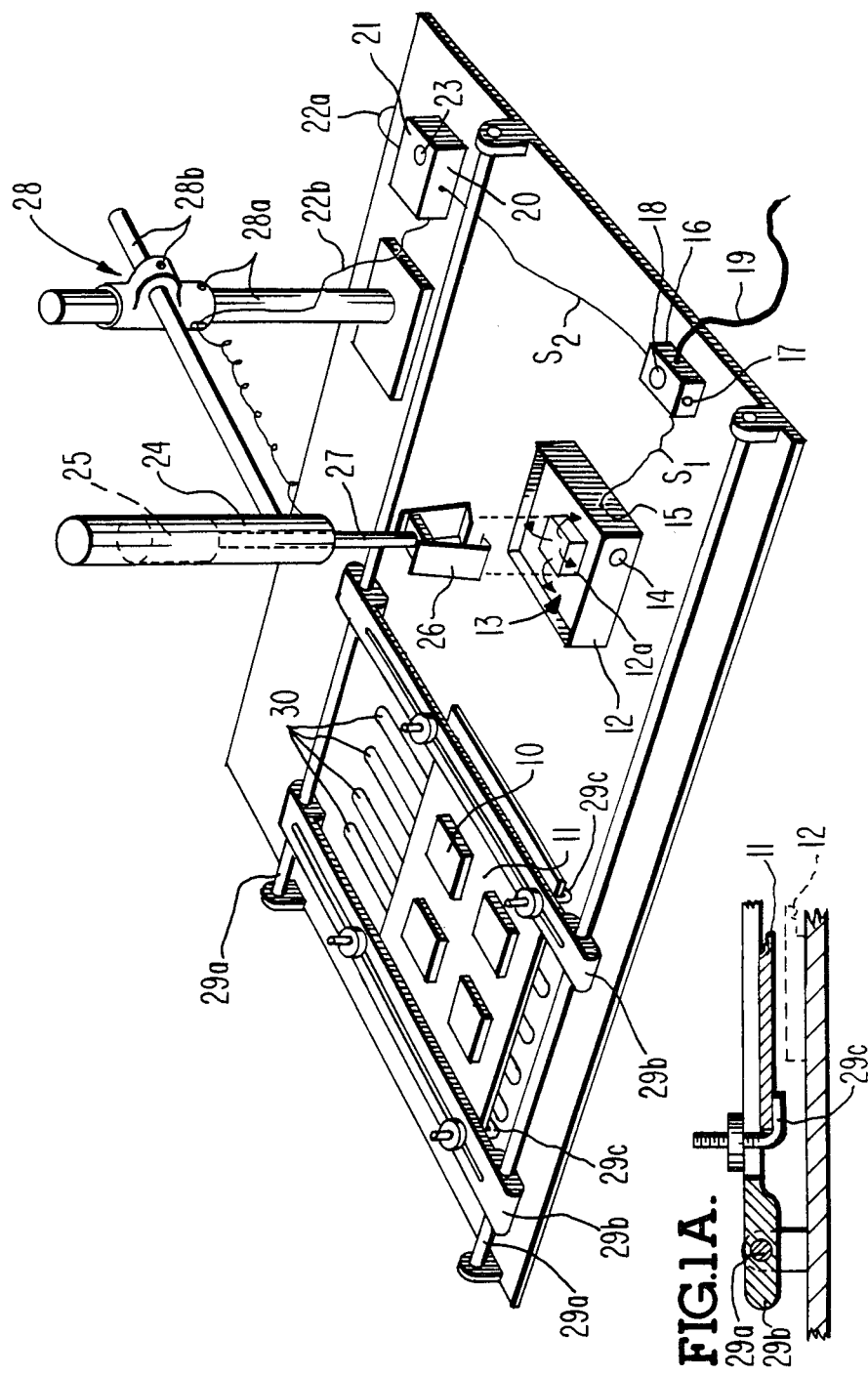
FIG. 1 is a pictorial view of an apparatus for removing integrated circuit packages from a printed circuit board in accordance with the present invention.

Referring now to FIG. 1, an apparatus for removing an integrated circuit package from a printed circuit board in accordance with the invention will be described. This apparatus includes a fountain 12 having a nozzle 12a from which the hot molen liquid 13 flows. Nozzle 12a is shaped such that the pattern of the molten liquid 13 which flows from the nozzle matches the perimeter of package 10. A rotary switch 14 selects the temperature of the molten liquid 13; and the flow of the liquid occurs whenever an electrical signal $S_1$ is sent to a control input terminal 15.

Signal $S_1$ which terminal 15 receives is sent by a timer 16. Timer 16 has a start button 17 which when it is pushed causes the control signal $S_1$ to be sent. A rotary switch 18 on the timer regulates the time duration $\Delta t_1$ of signal $S_1$. Electrical power to timer 16 is received via a cable 19.

Immediately after the end of time period $\Delta t_1$, timer 16 sends another electrical signal $S_2$ to a terminal 20 on an air valve 21. Compressed air passes into valve 21 via a tube 22a and it exits the valve via a tube 22b. Air valve 21 is initially closed and tube 22b is depressurized by pushing a button 23. Upon the receipt of signal $S_2$, valve 21 opens to allow the pressurized air to pass to tube 22b.

Tube 22b couples to a cylinder 24 which is fitted with a piston 25. A clamp 26 is coupled to piston 25 by a rod 27. Thus, the clamp 26 is moved by the piston 25 when the pressurized gas enters cylinder 24.

All of the components 24-27 are positioned directly over nozzle 12a by a stand 28. It has an arm-setscrew pair 28a which fixes the position of components 24-27 in the vertical plane; and it has another arm-setscrew pair 28b which fixes their position in the horizontal plane.

Also, a mechanism 29 is provided for positioning the package 10 that is to be removed in a direct line with nozzle 12a. It includes a pair of parallel rails 29a, a pair of arms 29b which slide on the rails 29a, and four L-shaped clamps 29c which slide on the arms 29b and hold board 11. In addition, an electric heater coil 30 is provided between and below the rails 29a and just to the left of fountain 12.

Figure 2A:
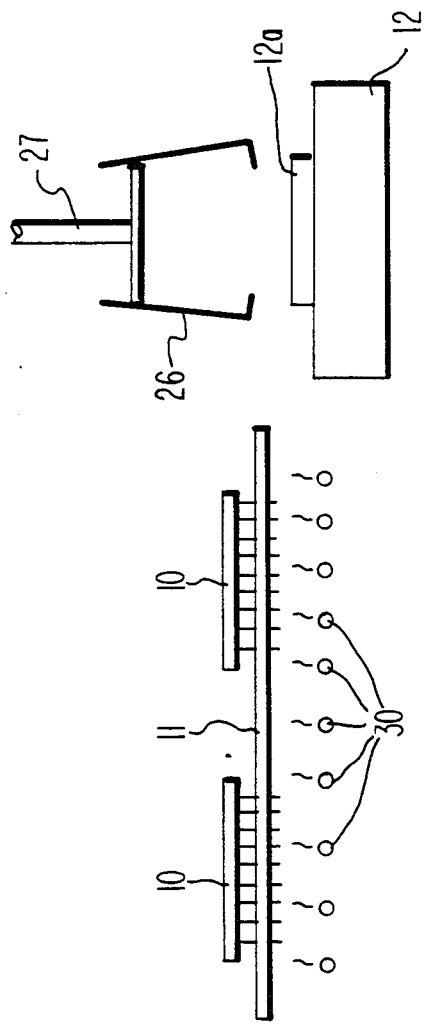
FIGS. 2A-2D illustrate the steps which the FIG. 1 apparatus performs to remove an integrated circuit package from a printed circuit board.

Turning now to FIGS. 2A–2D, the steps by which the FIG. 1 apparatus operates to remove a package 10 from board 11 will be described. Initially, as illustrated in FIG. 2A, clamp 26 is positioned directly over nozzle 12a. This is achieved by adjusting the arm-setscrew pairs 28a and 28b, and by pulling down on clamp 26 after cylinder 24 has been depressurized by pushing the air valve button 23.

Subsequently, board 11 is positioned such that package 10 which is to be removed is directly under clamp 26. This is achieved by sliding the arms 29b on the rails 29a, and by sliding the clamps 29c in slots of the arms 29b. After the alignment is complete, the arms 29b are slid on the rails 29a to move board 11 to the left over heater coil 30.

Board 11 is left over the rails 30 until its temperature is raised to about 100° C. This substantially reduces the magnitude of the temperature gradients that are induced in board 11 when it is subsequently placed in the molten liquid from nozzle 12a. A two-layer board takes about one minute to reach 100° C., and an eight-layer board takes about two minutes.

Figure 2B:
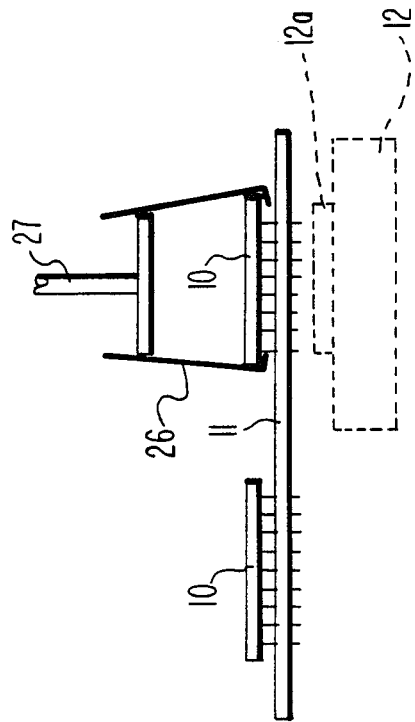

Thereafter, the package 10 that is to be removed is positioned directly under clamp 26. This is achieved merely by sliding the arms 29b on the rails 29a. Then clamp 26 is attached as shown in FIG. 2B to the package 10 that is to be removed. Preferably, the jaws of clamp 26 can accommodate packages of various sizes, and they are narrow enough to grip the package without touching any nearby component on the board.

Note that when the package 10 is positioned directly under clamp 26, board 11 overlies fountain 12 and thus it hides the fountain from view. However, since clamp 26 was aligned in FIG. 2A with nozzle 12a, attaching clamp 26 to package 10 automatically aligns the pins of that package over nozzle 12a.

Figure 2C:
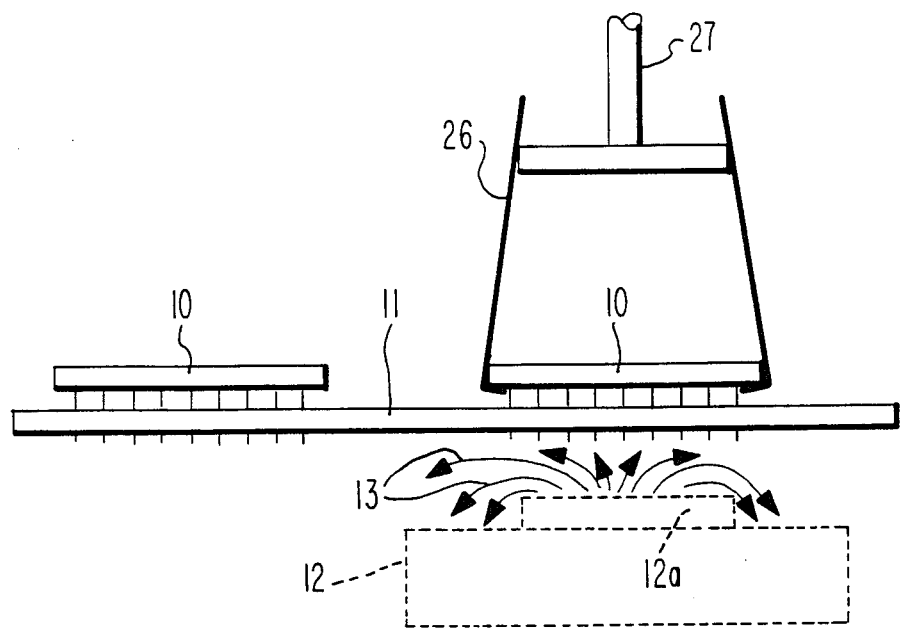

Subsequently, button 17 of timer 16 is pushed; and this in turn sends signal $S_1$ to fountain 12 which causes the molten liquid 13 to flow. This flowing liquid, as is illustrated in FIG. 2C, preferably touches the portion of the leads of package 10 that protrude through board 11 while touching little or none of the board at all.

A critical parameter at this stage of the process is the length of the time interval $\Delta t_1$ during which the molten liquid flows from nozzle 12a. Its lower limit must be long enough to ensure that all of the solder around all of the pins has melted. On the other hand, its upper limit must ensure that no thermal damage occurs to the board 11.

Heat from fountain 12 travels upward along the pin, and so the solder melts near the bottom of the board first and progressively melts through the board. An indication that the time interval $\Delta t_1$ is too short is that a cone-shaped piece of solder remains on the pins near the top of the board as the package 10 is pulled from the board. If such solder cones occur, it is likely that the joints between the board's metal plated holes and the board's internal conductors were overstressed during the removal process.

Heat from the pins also travels through the solder around the pins to the printed circuit board 11. This heat causes the metal plating of the holes for the leads to expand at a relatively high rate in comparison to the fiberglass epoxy portion of the circuit board. Such a difference in thermal expansion at temperatures above about 125° C. can be withstood for only a few seconds. Otherwise, overstressing of the joints between the board's metal plated holes and the board's internal conductors will again occur.

To select the length for time interval $\Delta t_1$, the following test procedure #1 is used. In this procedure, package 10 is pulled on with a constant force $F_1$ while the liquid 13 from nozzle 12a flows on the leads at a temperature of 60° C. to 80° C. above the melting temperature of the solder. An expression for the magnitude of force $F_1$ is given below. Under such conditions, the time interval $\Delta t_1$ should be adjusted to equal the time to pull the package from the board plus an additional one to three seconds.

To determine force $F_1$, the following test procedure #2 is used. First, a single pin is soldered into the board 11. Then the temperature of the board is held below, but within five degrees of, the melting temperature of the solder while the single pin is pulled with a force that slowly increases in magnitude. Eventually a force $F_2$ is reached that is the minimum at which the single pin, the solder around the pin, and metal in the metal plated hole pull from the hole.

Now the force $F_1$ should be set to $F_3 + (25$ to $75)\% F_2$ where $F_3$ is the minimum force needed to lift package 10 from a pool of the liquid 13 and $F_2$ is as defined above. Force $F_3$ includes the weight of package 10 and the surface tension that its leads make with the pool of liquid 13.

Figure 2D:
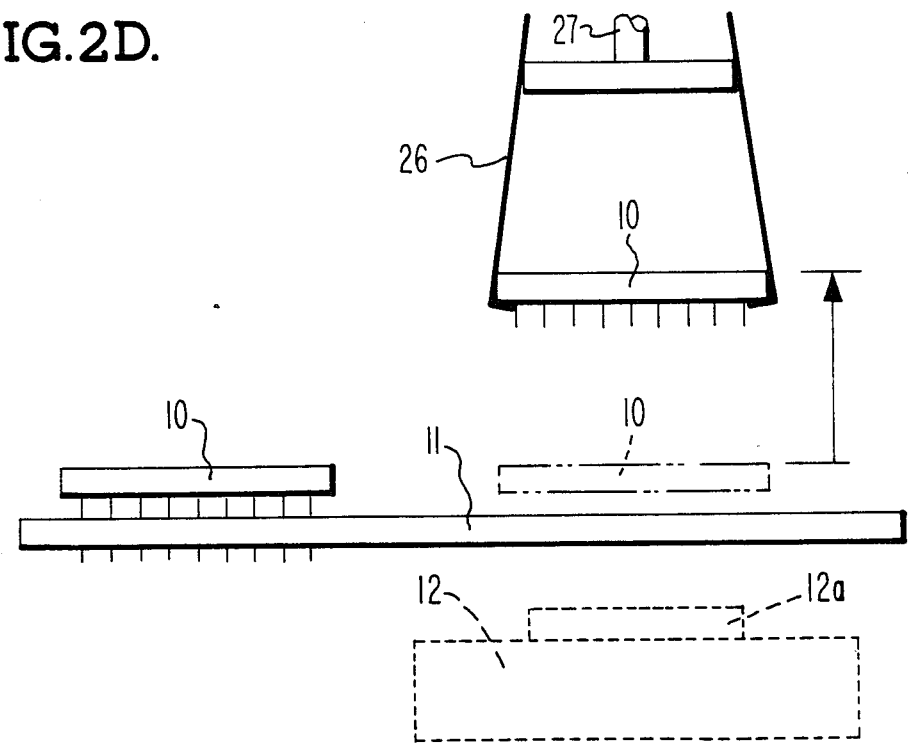

Immediately after time interval $\Delta t_1$ has elapsed in the process step of FIG. 2A, timer 16 sends signal $S_2$ to valve 21 which causes pressurized air to enter cylinder 24. Thus a force is exerted by piston 25 on package 10 which removes the package from the board. This is illustrated in FIG. 2D. In this stage of the process, the magnitude of the force with which the package is pulled is set to equal force $F_1$.

It should be pointed out that as the liquid 13 is heating the pins of package 10 in FIG. 2C, the solder does not melt around all of the pins at the same time instant. Instead, the solder melts around the pins in a random sequence until eventually only a single pin is left to be desoldered.

Thus, test procedure #2, which determines the magnitude of the force $F_2$ is carried out on just a single pin. If a force larger than force $F_3 + (25$ to $75)\% F_2$ is exerted by piston 25 on the package during the step of FIG. 2D and the package is held by one or just a few pins, the package will be pulled from the board even though the solder is still in a solid or quasi-solid state. Such a removal will overstress the joints between the board's plated metal holes and the board's internal conductors.

Consider now the specific example of a seventy-two pin ceramic package that is soldered into an eight-layer fiberglass epoxy board. Suppose also that the package weighs $\frac{1}{4}$ pound, and the solder consists of 60% lead and 40% tin which melts at about 170° C.

For this case, force $F_2$ as found by test procedure #2 equals four pounds. Force $F_1$ then equals $F_3 + (25$ to $75)\% 4$ or ($1\frac{1}{4}$ to $3\frac{1}{4}$) pounds. Using force $F_1$ in test procedure #1, the package will pull from the board in two seconds. Thus for this package, $\Delta t_1$ should be set to three-five seconds.

Figure 3:
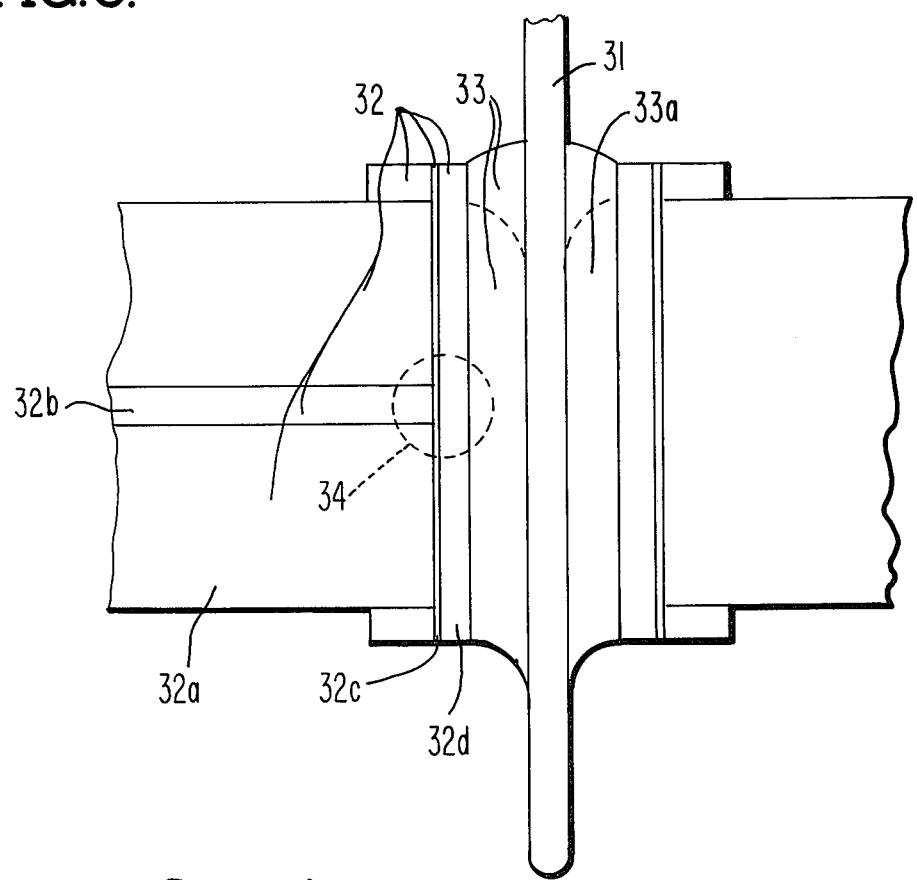
FIG. 3 is a greatly enlarged cross-sectional view of a conductive junction that a single pin makes in a printed circuit board.

To better understand the overstressing problem which this invention solves, reference should now be made to FIG. 3 which illustrates the cross section of a soldered joint that a single pin makes with the printed circuit board. In this figure, reference numeral 31 indicates the pin; reference numeral 32 indicates the printed circuit board; and reference numeral 33 indicates the solder which holds pin 31 to the board 32.

Component 32a of the board 32 is fiberglass epoxy. Component 32b is an internal copper line to which pin 31 makes an electrical connection. Component 32c is electroless copper that is deposited on the walls of the hole into which pin 31 fits. It typically is 100 micro inches thick. Component 32d is electroplated copper which is deposited on top of the electroless copper 32c; and it typically is 0.001 inches thick.

In the above structure, the weakest joint 34 is between the copper plating 32c-32d and the fiberglass epoxy 32a. This joint 34 is the one that fractures during test procedure #2. It is so weak that it will fracture if pin 31 is pulled with too large a force during the package removal process while only a portion of the solder 33 (such as portion 33a) is melted. Also, the probability that joint 34 will fracture is considerably increased if it is heated above 125° C. for just a few seconds during the package removal process.

Any fracture of joint 34 substantially increases the electrical resistance of the joint and may even cause an open circuit. In either case, the board is unuseable.

Figure 4:
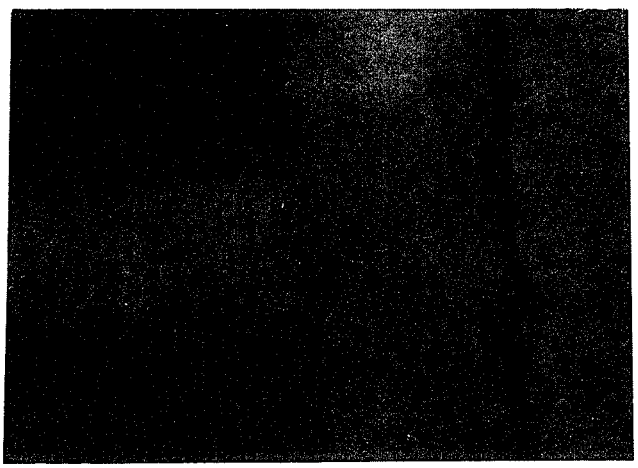
FIG. 4 is a microphotograph of a conductive junction in a printed circuit board that has been fractured by a prior art process for removing integrated circuit packages.

FIG. 4 is a microphotograph of an actual joint 34 that has been fractured by pulling on a package with a constant force of five pounds during the package removal process. Such a fracture can be detected electrically by measuring the resistance across the joint. By comparison, over one hundred packages were removed in a test by the steps of the present invention as described in FIGS. 2A-2D, and no significant increase in resistance across the joint 34 was detected.

An apparatus for, and method of, removing an integrated circuit package from a printed circuit board in accordance with the invention has now been described in detail. In addition, however, many changes and modifications can be made to those details without departing from the nature and spirit of the invention.

For example, there can be any number of pins on the package 10 that is to be removed. However, the invention is particularly useful when the package has at least fifty pins because with such a large number of pins, it is impractical to desolder them in a conventional one-at-atime fashion.

Also, the printed circuit board 11 from which the package 10 is to be removed can have any structure. In particular, it can have any number of internal conductive layers 32b; the conductive layers 32b can be made of etched metal or discrete wires; and any type of insulating materials, such as teflon or a polyimide, can be used to separate the conductive layers.

If several different types of packages are to be removed from several different types of printed circuit boards, test procedures #1 and #2 as described determine the duration of time interval $\Delta t_1$ and the magnitude of force $F_1$ should be performed for each package-board type combination on which the invention is to be used. Then, all of the package-board combinations which have a similar $\Delta t_1$ time (i.e., within one second of each other) and a similar $F_1$ force (i.e., within one-half pound) can use the exact same removal process. For example, time interval $\Delta t_1$ and force $F_1$ should not vary significantly with the number of pins on a package provided the remainder of the package construction and board construction is the same.

Various compositions for the molten liquid 13 may be utilized with the invention. For example, liquid 13 may be a lead-tin solder or any other type of solder.

In view of the above, it is to be understood that the invention is not limited to all of the above-described details but is defined by the appended claims.

What is claimed is:

1. A method of removing an integrated circuit package that has multiple leads which are soldered into respective metal plated holes in a printed circuit board, said board being of the type that has internal metal lines which make joints with said metal plating and said method being adapted to remove said package from said board without overstressing said joints; said method including the steps of:

flowing a liquid on said leads at a temperature higher than the melting temperature of said solder without pulling on said package for a time period $\Delta t_1$; and pulling on said package immediately after the end of said $\Delta t_1$ period with a force $F_1 = F_3 + (25 \text{ to } 75)\% F_2$;

wherein $F_2$ is the minimum force that will extract a single soldered lead from said board under the condition the solder is below but within 5° C. of melting; $F_3$ is the minimum force that will lift said package from a pool of said liquid; and $\Delta t_1$ is the time it takes to pull said package from said board with force $F_1$ being continuously applied while said liquid is flowing on the package leads to melt the solder plus one to three seconds.

2. A method according to claim 1 wherein said package has at least fifty leads.

3. A method according to claim 1 wherein said printed circuit board, except for said internal metal lines and said metal plating, consists essentially of a fiberglass epoxy.

4. A method according to claim 1 wherein said time period $\Delta t_1$ is three to five seconds.

5. A method according to claim 1 wherein said force $F_1$ is $1\frac{1}{4}$ to $3\frac{1}{4}$ pounds.

6. A method according to claim 1 wherein said leads are patterned in an array and said molten substance flows from a fountain with the same pattern.

7. A method according to claim 1 wherein said liquid is 60° C. to 80° C. above the melting temperature of said solder.

8. A method according to claim 1 and further including the substeps of sensing the end of period $\Delta t_1$ with an electronic timer and, in response, exerting force $F_1$ on said package by electronically activating the movement of a piston which couples to said package.

9. A method according to claim 1 and further including the substep of heating said board and said package in hot air to a temperature above ambient but below the melting point of said solder immediately prior to said flowing step to mitigate thermal shock and temperature gradients on said joints by the subsequent flowing step.

10. A method of removing from a printed circuit board, a leaded integrated circuit package that is soldered into said board; said method including the steps of:

coupling a piston in a cylinder which is adapted to be filled with a compressed gas to said package;

flowing a liquid at a temperature higher than the melting temperature of said solder on said leads for a time period which is a few seconds greater than the time it takes said liquid to melt all of the solder on all of said leads; and injecting said compressed gas into said cylinder immediately after the end of said period to move said piston with a force $F_1 = F_3 + (25 \text{ to } 75)\% F_2$ where $F_2$ is the minimum that will extract a single lead from said board under the condition that the solder around said single lead is just a few degrees below melting and $F_3$ is the minimum force that will lift said package from a pool of said liquid.

* * * * *